US012699034B2

(12) United States Patent
Hanay et al.

(10) Patent No.: US 12,699,034 B2
(45) Date of Patent: Aug. 4, 2026

(54) SIMULTANEOUS MASS AND CAPACITANCE CHANGE MEASUREMENT FOR DEFINING NANOPARTICLES SUCH AS NANOPLASTIC, VIRUS, BY DETERMINING THEIR SIZE AND MATERIAL PROPERTIES AT THE PARTICLE LEVEL

(71) Applicant: IHSAN DOGRAMACI BILKENT UNIVERSITESI, Cankaya/Ankara (TR)

(72) Inventors: Mehmet Selim Hanay, Cankaya/Ankara (TR); Batuhan Emre Kaynak, Cankaya/Ankara (TR); Mohammed Alkhaled, Cankaya/Ankara (TR); Ramazan Tufan Erdogan, The Hague (NL); Uzay Tefek, Etimesgut/Ankara (TR); Berk Kucukoglu, Cankaya/Ankara (TR); Hashim Alhmoud, Cankaya/Ankara (TR); Mehmet Kelleci, Cankaya/Ankara (TR); Yagmur Ceren Alatas, Cankaya/Ankara (TR); Enise Kartal, Cankaya/Ankara (TR)

(73) Assignee: IHSAN DOGRAMACI BIL KENT UNIVERSITESI, Cankaya/Ankara (TR)

( * ) Notice: Subject to any disclaimer, the term of this patent is extended or adjusted under 35 U.S.C. 154(b) by 149 days.

(21) Appl. No.: 18/837,247

(22) PCT Filed: Feb. 3, 2023

(86) PCT No.: PCT/TR2023/050084
§ 371 (c)(1),
(2) Date: Aug. 9, 2024

(87) PCT Pub. No.: WO2023/154028
PCT Pub. Date: Aug. 17, 2023

(65) Prior Publication Data
US 2025/0172482 A1     May 29, 2025

(51) Int. Cl.
*G01N 15/1031*     (2024.01)
*G01D 5/24*     (2006.01)
(Continued)

(52) U.S. Cl.
CPC ........... *G01N 15/1031* (2013.01); *G01D 5/24* (2013.01); *G01D 5/2405* (2013.01); *G01R 27/26* (2013.01);
(Continued)

(58) Field of Classification Search
CPC ........ G01N 15/00; G01N 15/10; G01R 27/00; G01R 27/02; G01R 27/26; G01D 5/00; G01D 5/12; G01D 5/14; G01D 5/24
(Continued)

(56) References Cited

U.S. PATENT DOCUMENTS

2011/0043607 A1* 2/2011 Grier .................. G01N 15/0227
356/450

FOREIGN PATENT DOCUMENTS

| CN | 107946165 A1 | 4/2018 | |
|----|----|----|----|
| EP | 0423380 A1 * | 4/1991 | ........... B65H 63/062 |

(Continued)

*Primary Examiner* — Hoai-An D. Nguyen
(74) *Attorney, Agent, or Firm* — Tarolli, Sundheim, Covell & Tummino LLP

(57)     ABSTRACT

The present invention relates to an analyzer and method for simultaneously determining both size and material properties of a single nanoparticle. In the present invention, both the mass of the nanoparticle and the change in capacitance induced on a capacitive sensor by the nanoparticle are measured simultaneously, and thus the size and material properties of the nanoparticle are determined. An analyzer for simultaneously determining the size and material prop-
(Continued)

erties of a nanoparticle is described with the present invention, this device comprises a mass sensor, a capacitor sensor and a common precise measurement region of the mass sensor and capacitor sensor, wherein said mass sensor and capacitor sensor provide common measurement. The present invention can be used in the field of biomedical, environmental engineering and materials engineering.

20 Claims, 7 Drawing Sheets

(51) Int. Cl.
  *G01R 27/26* (2006.01)
  *G01N 15/10* (2006.01)

(52) U.S. Cl.
  CPC . *G01R 27/2605* (2013.01); *G01N 2015/1021* (2024.01)

(58) Field of Classification Search
  USPC ................................. 324/600, 649, 658, 663
  See application file for complete search history.

(56) References Cited

FOREIGN PATENT DOCUMENTS

| EP | 0992768 | A2 | 4/2000 | |
| FR | 2622002 | A1 * | 4/1989 | ............... G01F 1/74 |
| WO | 2018/172450 | A1 | 9/2018 | |

* cited by examiner

SIMULTANEOUS MASS AND CAPACITANCE CHANGE MEASUREMENT FOR DEFINING NANOPARTICLES SUCH AS NANOPLASTIC, VIRUS, BY DETERMINING THEIR SIZE AND MATERIAL PROPERTIES AT THE PARTICLE LEVEL

TECHNICAL FIELD OF THE INVENTION

The present invention relates to an analyzer and method for simultaneously determining both size and material properties of a single nanoparticle. In the present invention, both the mass of the nanoparticle and the change in capacitance induced on a capacitive sensor by the nanoparticle are measured simultaneously, and thus the size and material properties of the nanoparticle are determined. The present invention can be used in the field of biomedical, environmental engineering and materials engineering.

STATE OF THE ART

Nanoparticles are particles which are less than 1000 nanometers in size, measured in nanometers (nm; 1 nm=10–9 meters). Determination of the size and material properties of nanoparticles such as nanoplastics, biological nanoparticles, and engineered nanoparticles (such as quantum dots, magnetic and fluorescent nanoparticles) has industrial importance in fields such as biomedical, environmental engineering and materials engineering.

Nanoplastics are plastic particles smaller than 1 micrometer in size; these particles are released into the environment as part of plastic pollution. Until today, the screening of plastic pollution has been limited to microplastics (plastic particles larger than 1 micrometer), which analytical instruments can measure. Nanoplastic particles have a much higher mobility than microplastics and can reach critical organs by passing through tissues. Microplastics are observed in marine organisms, drinking water, and objects such as polypropylene baby bottles disinfected with hot water. However, there is currently no efficient way to measure nanoplastics.

Most virus capsids are 20-500 nm in diameter, and viruses are considered naturally occurring nanoparticles due to their size at the nanometer scale. Many different viruses are studied for various applications in nanotechnology; for example, mammalian viruses are being developed as vectors for gene transfer and bacteriophages and plant viruses are used in vaccines and immunotherapy intervention, as well as in drug delivery and imaging applications. The detection and analysis of biological nanoparticles such as viruses without labeling is important in the biomedical field in terms of starting to work against new threats even before PCR and antigen tests were developed.

On the other hand, it is necessary to determine the properties of nanoparticles produced for industrial reasons (for example, quantum dots, magnetic nanoparticles used in lighting and TV technology) in terms of size and material, and to optimize their purity accordingly in the field of materials science.

Today, there are two different approaches for the characterization of nanoparticles. These are as follows; measurement of physical properties and the determination of what the material is, that is, the material characterization. Methods such as scanning electron microscope (SEM), transmission electron microscope (TEM), atomic force microscope (AFM), dynamic light scattering (DLS), charge detecting mass spectrometry (CDMS), and Ion Mobility Spectrometer (IMS) are used for the measurement of physical properties. In addition to these methods, the recently developed nano-electromechanical systems-based mass spectrometry (NEMS-MS) can also measure the mass of individual nanoparticles. Accordingly, these methods measure physical properties such as diameter and mass, however, it cannot determine by itself what the material type of the measured particle is.

Conventional material characterization methods are X-ray photo-electron spectrometry (XPS), energy dispersion X-ray spectrometry (abbreviated as EDS or EDX), and Raman spectrometry. However, these methods alone do not provide information about particle sizes. Moreover, even when combined with an optical microscope (like microRaman spectrometry), these methods, do not work on samples smaller than 450 nm in size, due to the diffraction limit of light.

Today, the only commercial method for simultaneous physical and material analysis of nanoparticles is the combination of scanning electron microscope (SEM) and energy distribution X-ray spectrometry (EDS, EDX) methods. However, these devices are both very costly and bulky since they contain a vacuum system. Furthermore, the number of nanoparticles that these devices can analyze per unit time is low. In addition, it is difficult to use this method directly for non-conductive samples such as nanoplastics and viruses. Such samples have low contrast under scanning electron microscopy and therefore physical measurement becomes difficult. Metal must be coated on these samples beforehand so as to measure the same under the scanning electron microscope. However, said metal coating process increases the analysis time and cost, while reducing its reliability.

In the state of the art, there is a need to develop an analysis device and method that is low cost, does not contain a vacuum system, has small dimensions, can determine both the size and material properties of a nanoparticle with a single device, without the need for an additional step or device due to the high cost of the existing devices and the methods used, their large size because they contain a vacuum system, and thus they take up a lot of space, inability to use the aforementioned devices and methods without an additional metal coating step for non-conductive samples such as nanoplastics and viruses and reduction of analysis reliability with this metal coating process.

BRIEF DESCRIPTION OF THE INVENTION

The present invention relates to an analysis method that enables the simultaneous determination of both the size and material properties of a single nanoparticle and to an analysis device wherein this method is applied. Herein, both the mass of the nanoparticle and the capacitance change in a capacitive sensor are measured simultaneously, and the material of the nanoparticle is understood as a result of this measurement.

The main aim of the present invention is to enable the determination of both size and material properties of a nanoparticle with a single device simultaneously. Both the mass of the nanoparticle and the capacitance change in a capacitive sensor are measured with the present invention. The class of the material such as plastic, organic powder, inorganic nanoparticle is determined by using these two measurement results. In addition to the class of the material, both size and material characterization of a single nanoparticle is practically performed since the mass is also measured.

Another aim of the invention is to provide a low cost and practical method compared to the prior art that can be used in the field of biomedical, materials engineering and environmental engineering. The prior art SEM-EDX combination analysis method is expensive and large; it also requires a vacuum system. Therefore, it is used only in a central laboratory and cannot be taken to measurement areas. On the other hand, the analyzer subject to the present invention is a low-cost and portable system that can operate directly in atmospheric conditions; it does not contain vacuum system and sensitive optical lens components. Thus, a low-cost and practical method is provided with the present invention compared to the prior art.

Since the size of the material as well what the material is determined with a single analyser in the present invention, for example, it is possible to separate nanoplastics or virus particles from other nanoparticles. It is possible to directly detect nanoparticles in the air and to separate the particles showing virus characteristics from other nanoparticles such as organic dust and sand dust with the device subject to the present invention, which is easily portable and has a low cost compared to the prior art. Furthermore, since the size that analytical instruments used in the prior art can measure effectively is limited to microplastics (plastic particles larger than 1 micrometer), the size and material properties of nanoplastics are determined and the need for analysis in the field of nanoplastics is met with the present invention.

It is possible to develop an analysis device and method with the present invention that can determine both the size and material properties of a nanoparticle with a single device, with a low cost, high number of nanoparticles that it can analyze in unit time, without the need for an additional step or device.

Figure 1:
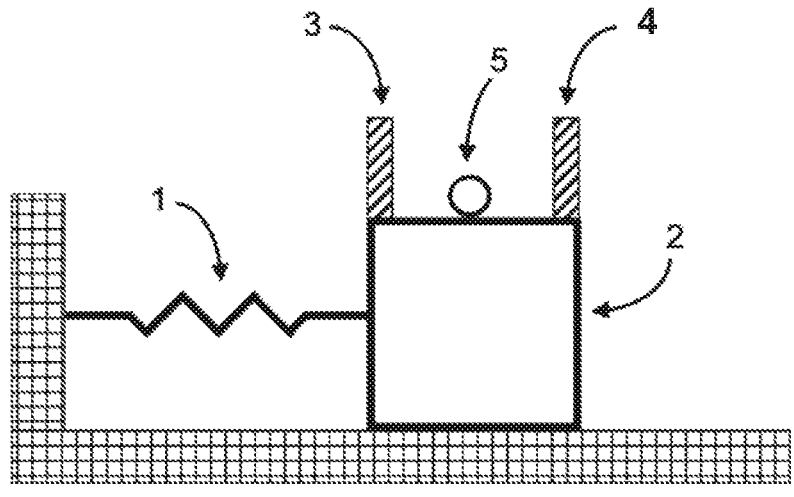
FIG. 1: View of the conceptual description of the present invention.

DEFINITIONS OF ELEMENTS/PARTS THAT CONSTITUTE THE INVENTION 1. flexible spring
2. platform
3. (+) electrode
4. (−) electrode
5. nanoparticle
7. outer ring
8. inner ring
9. active region of mass sensor and capacitor sensor
10. narrowing extension of the inner ring
11. mass sensor contact pad 13. common precise measurement region of mass sensor and capacitor sensor
14. mass sensing control and measuring electrodes
15. precise measurement region of the mass sensor only
16. precise measurement region of the capacitor sensor only
17. mass sensor beam
21. capacitor sensor contact pad

DETAILED DESCRIPTION OF THE INVENTION

The present invention relates to an analyzer and an analysis method for determining both size and material properties of a single nanoparticle, such as a nanoplastic, biological nanoparticle or engineered nanoparticle, and to an analysis device wherein this method is applied. In the present invention, both the mass of the nanoparticle and the change in capacitance in a capacitive sensor are measured, and thus the properties of the material are determined.

Figure 4:
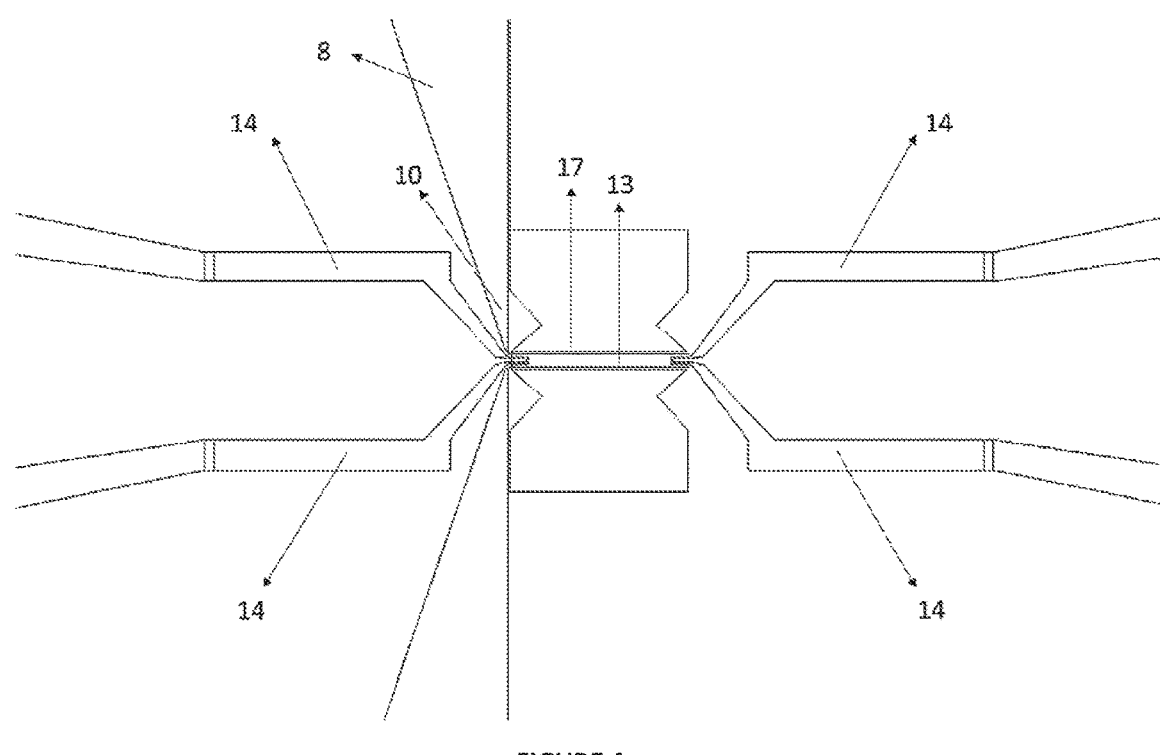
FIG. 4: Detailed view of the active region in the first embodiment of the analyzer.
Figure 5:
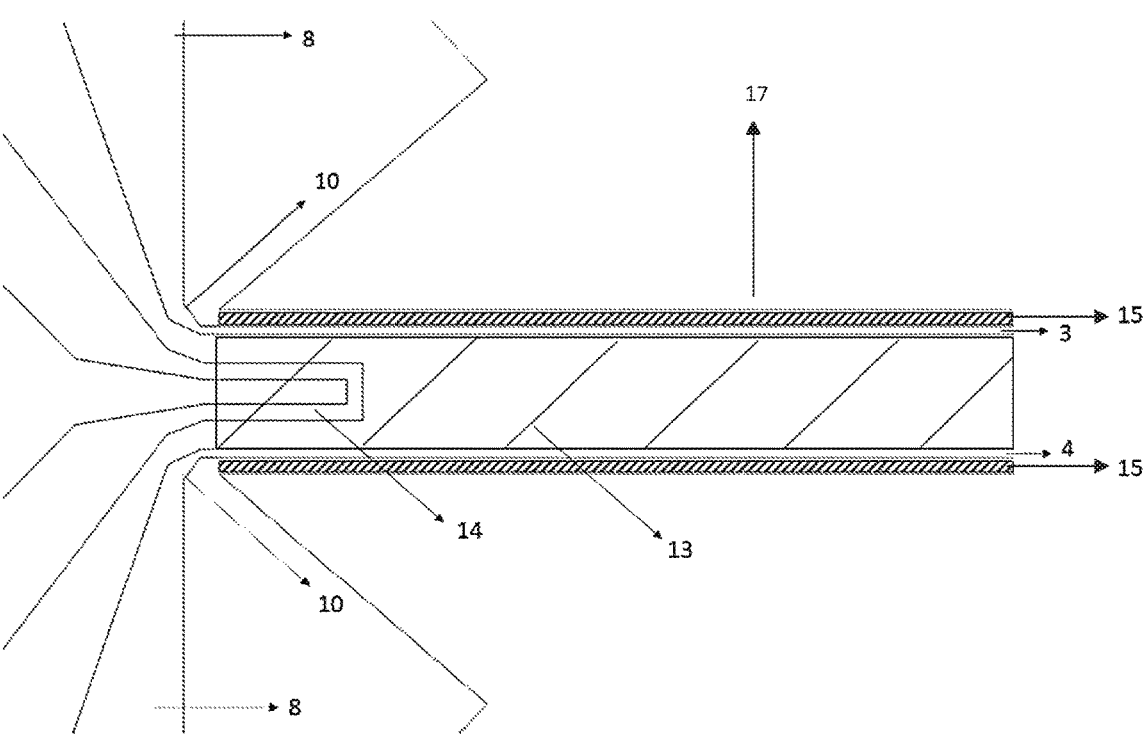
FIG. 5: Close-up view of the mass and capacitor sensors in the active region in the first embodiment of the analyzer.
Figure 6:
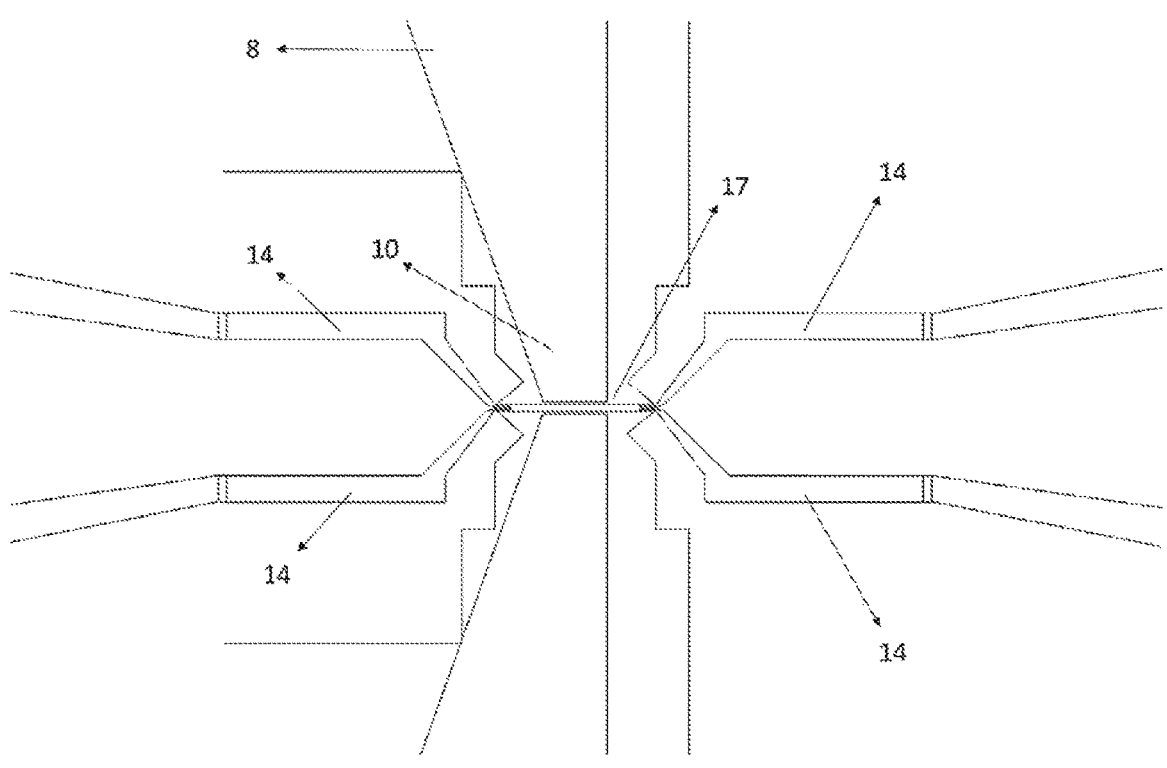
FIG. 6: Detailed view of the active region in the second embodiment of the analyzer.
Figure 7:
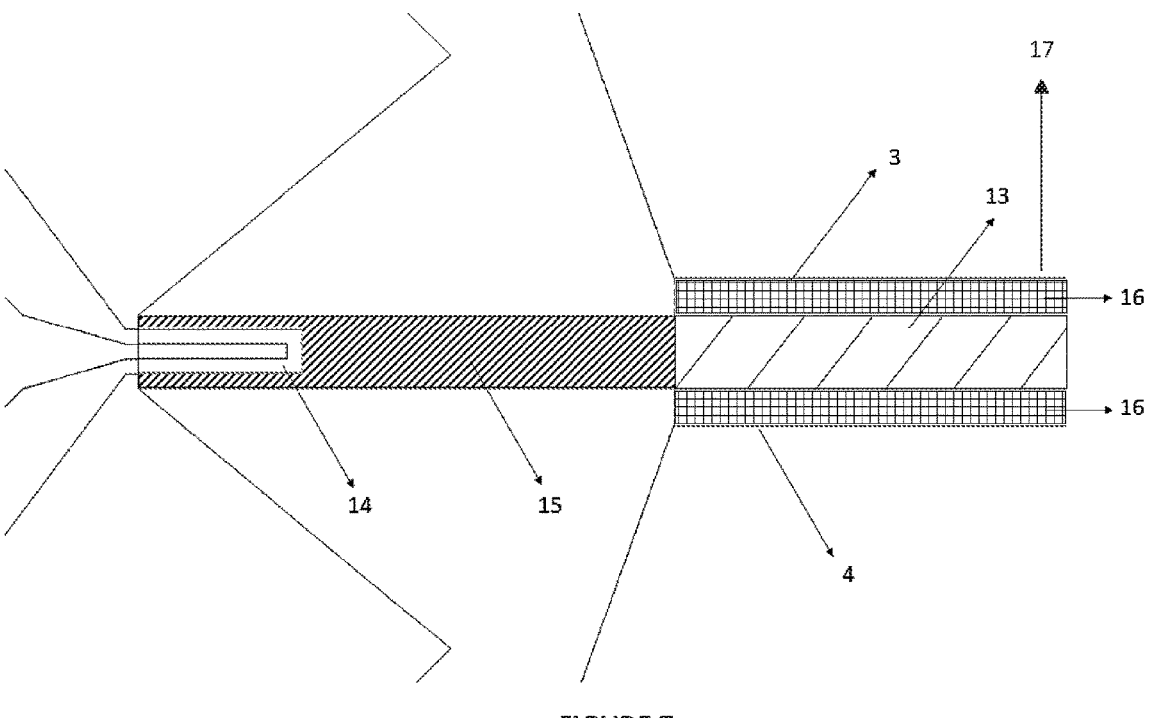
FIG. 7: Close-up view of the mass and capacitor sensors in the active region in the second embodiment of the analyzer.

There are four basic configurations of the analyzer wherein the analysis method of the present invention is applied. The first embodiment of said analyzer is shown in FIG. 4 and FIG. 5, and the second embodiment of the device is shown in FIG. 6 and FIG. 7. The third embodiment of the device is the heterogeneous version of the first embodiment, and the fourth embodiment of the device is the heterogeneous version of the second embodiment. There are eight different applications that can be performed using the four basic configurations of the analyzer in the analysis methods that are the subject of the present invention.

The analyzer for simultaneously determining the size and material properties of a nanoparticle, comprises a mass sensor, a capacitor sensor and a common precise measurement region (13) of the mass sensor and capacitor sensor, wherein said mass sensor and capacitor sensor provide common measurement. The analyzer which is the subject of the present invention applies the method of determining the material type by measuring the same nanoparticle by the mass sensor and capacitor sensor and calculating an intensive property (Formula 1) using the measurements there. The analyzer comprises of the following; a mass sensor, a capacitor sensor comprising (+) electrode (3) and (−) electrode (4) portions, outer ring (7) and inner ring (8), required to form a capacitor sensor, mass sensor contact pad (11) and capacitor sensor contact pad (21) connecting the mass sensor to external electronic measuring devices, common precise measurement region of the mass sensor and capacitor sensor, where the two sensors provide common measurement (13) and mass sensor control and measurement electrodes (14) used for electronic control and measurement of the mass sensor. In addition; there is a processor inside the analyzer or separately from the analyzer in an electronic mobile device for making measurements in said device and calculating the formulas mentioned in the method of the present invention and this processor divides the nanoparticle mass and capacitance change signals from two different sensors (mass and capacitor sensors) measuring the same nanoparticle. The sensors mentioned in the present invention are connected to electronic mobile devices. Information from these devices is received by the mobile device, preferably computer, and processed according to the formulas described in the process steps of the present invention. The effect of the nanoparticle when it comes to the common precise measurement region (13) of the mass sensor and the capacitor sensor is measured and calculated. The mobile devices mentioned here can be electronic devices such as computers, phones or tablets.

Figure 2:
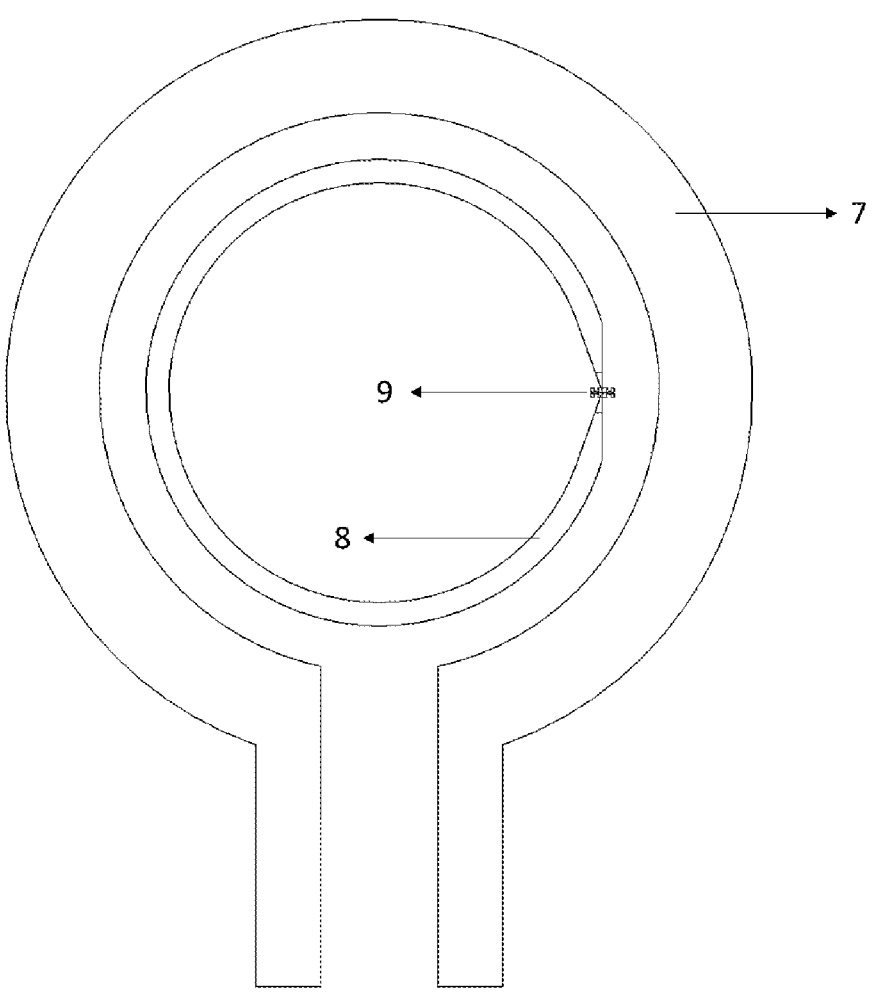
FIG. 2: General view of the analyzer.
Figure 3:
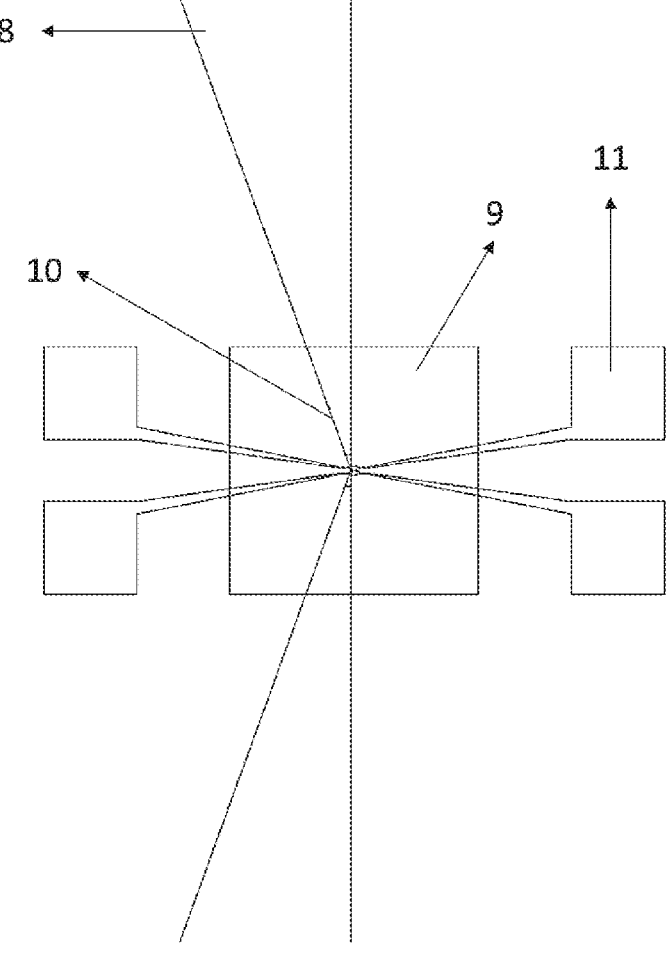
FIG. 3: General view of the active region of the analyzer.
Figure 8:
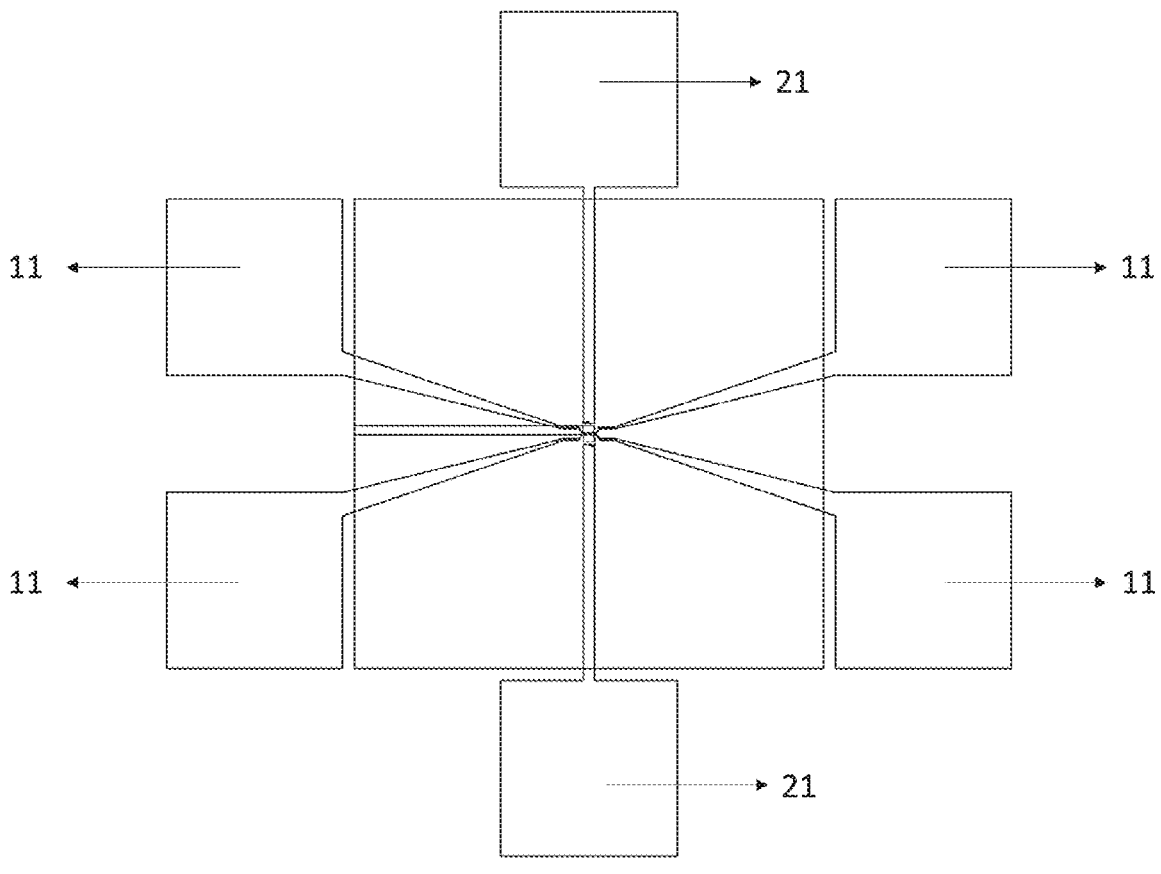
FIG. 8: View of the analyzer with the contact pads.

FIG. 2 shows the outer ring (7) and the inner ring (8) required to construct a specific type of capacitor sensor (e.g. split-ring resonator (SRR)-based microwave detector). The outer ring (7) is used to electrically excite the inner ring (8). In FIGS. 4-7, the active region (9) of the mass sensor and capacitor sensor in the configurations of the analyzer is shown in detail in close-up form; also shown here is the narrowing extension (10) of the inner ring as a continuation of the inner ring (8). The active region (9) of the mass sensor and capacitor sensor, seen in FIG. 2 and shown in the square in FIG. 3, is the region where precision workmanship and measurement processes take place, it refers to the area containing the common precise measurement region (13) of the mass sensor and the capacitor sensor. As seen in FIG. 3 and FIG. 8, there are contact pads for the connection of the device subject to the present invention to the outside world.

The common precise measurement region (13) of the mass sensor and capacitor sensor between the (+) electrode (3) and (−) electrode (4), which is shown broadly in FIG. 5 and FIG. 7; is the region where mass and capacitor sensors work together and measures the nanoparticle falling into this precise measurement region. Since a nanoparticle falling outside the common precise measurement region (13) of the mass sensor and the capacitor sensor (the precise measurement region of the mass sensor only (15) or the precise measurement region of the capacitor sensor only (16)) cannot be detected by both sensors as common, it will not receive a signal from either the mass sensor or the capacitor sensor. If the nanoparticle falls in the precise measurement region of the mass sensor only (15) or in the precise measurement region of the capacitor sensor only (16), the measurement will not be performed. Therefore, the measurement is made in the common precise measurement region (13) of the mass sensor and the capacitor sensor, which is especially shown in FIG. 5 and FIG. 7.

Figure 9:
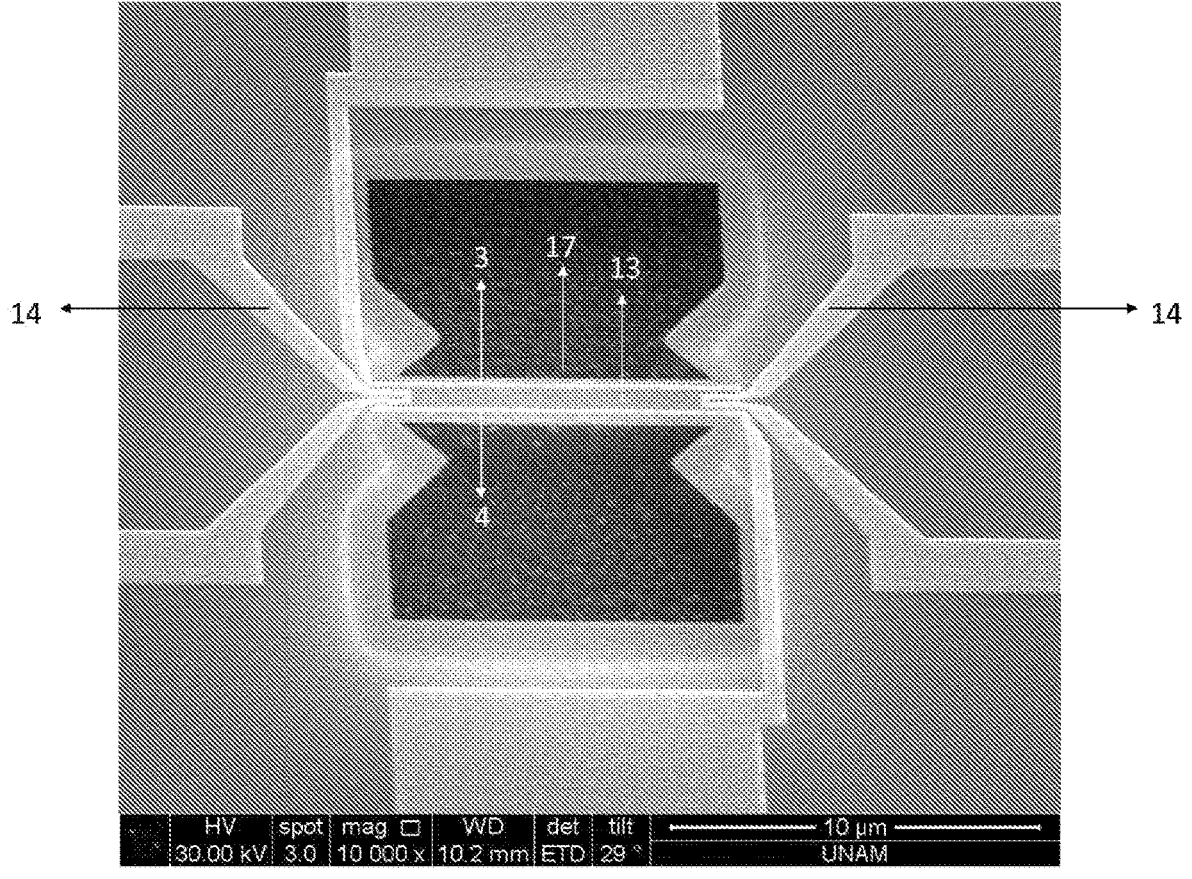
FIG. 9: Microscopic view of the chip portion of the analyzer.
Figure 10:
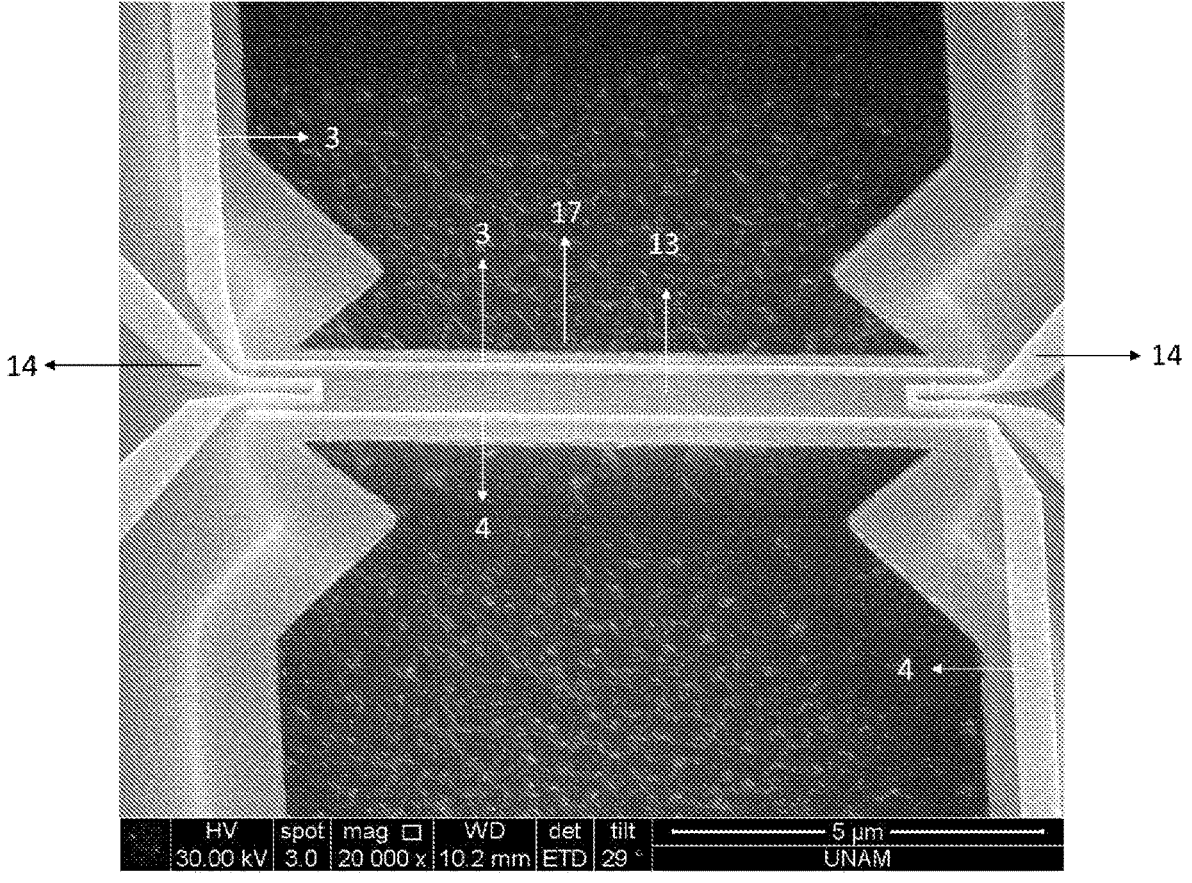
FIG. 10: Detailed microscopic view of the chip portion of the analyzer and the mass-sensing beam.

In one embodiment of the present invention, the mass sensor is in the form of a suspended beam positioned on the chip and not in direct contact with the silicon substrate. Since this mass sensor beam (17) is suspended in the air, it becomes easier to trigger the mechanical movement of the sensor and to measure the vibration amplitude. In this embodiment of the present invention, the mass-sensing beam (17) is preferably made of silicon nitride material and is suspended on the silicon substrate. Silicon nitride is preferably a 100 nm layer on the silicon substrate. In FIGS. 4-7, the mass sensor beam (17) suspended in the air, which is mentioned in an embodiment of the invention, is seen. In FIG. 9 and FIG. 10, the image of the chip part of the device subject to the present invention (preferably the chip of NEMS) and the mass sensor beam (17) located here are shown. There are common precise measurement region of mass sensor and capacitor sensor (13) on the mass sensor beam (17), only the tip of the mass sensor suspended in the air, precise measurement region (15), (+) electrode (3) and (−) electrode (4) on the mass sensor control and measurement electrodes (14) (FIG. 5). In the invention, an analysis method using the analysis device subject to the present invention is described so as to determine the size and material properties of the nanoparticle simultaneously, and this method essentially comprises the following, Measuring the mass of the nanoparticle ($m_{particle}$) with the mass sensor in the common precise measurement region (13) of the mass sensor and the capacitor sensor, In the same system, measurement of the capacitance change (ΔC) formed by the same nanoparticle by the capacitor sensor in the common precise measurement region (13) of the mass sensor and capacitor sensor, according to Formula 3:

$$\Delta C = \left(\frac{C_0}{\epsilon_0 V_0}\right) V_{particle} \times \left(3 \times \frac{\epsilon_r - 1}{\epsilon_r + 2}\right) \qquad \text{Formula 3}$$

wherein $C_0$ is the pre-measurement capacitance of the capacitor sensor, $\epsilon_0$ is the electrical permittivity of empty space, $\epsilon_r$ is the relative dielectric coefficient of the particle, $V_0$ is the active measuring volume of the capacitor sensor, Calculation of the $C_{particle}$ value, which is the capacitance change normalized by the processor in electronic mobile devices by scaling the quantity ΔC measured according to the formula 3 according to the characteristics of the capacitor sensor, and dividing the same by the expression $$\left(\frac{C_0}{\epsilon_0 V_0}\right):$$

$$C_{particle} \equiv \frac{\Delta C}{\left(\frac{C_0}{\epsilon_0 V_0}\right)} \qquad \text{Formula 4}$$

processing of the signal ratio of the nanoparticle by the processor in electronic mobile devices according to Formula 1 by taking the ratio of the mass ($m_{particle}$) of the nanoparticle to the normalized capacitance change ($C_{particle}$) of the nanoparticle, determining the same and obtaining a factor based on the particle's density ($d_{particle}$) and the relative dielectric coefficient ($\epsilon_r$), $$\text{Signal Ratio} \equiv \frac{m_{particle}}{C_{particle}} = \frac{d_{particle}}{\left(3 \times \frac{\epsilon_r - 1}{\epsilon_r + 2}\right)} \qquad \text{Formula 1}$$

Determining the material property of the nanoparticle according to the signal ratio of the nanoparticle calculated by said processor according to the formula 1.

The nanoparticles mentioned here can be in different shapes, especially in spherical or spherelike form.

As seen in FIG. 1, flexible spring (1) and platform (2) are used as mass sensors so as to understand the present invention conceptually. The electrodes (3, 4) on the platform (2) act as a capacitor. The mass of a nanoparticle (5) falling on the system can be measured by monitoring the mechanical resonance frequency in this system. Meanwhile, there is a capacitor (condenser) formed by the electrodes (3, 4) on this system. The total capacitance of this capacitor can also be measured with a capacitive Wheatstone bridge or by setting up a resistor-inductor-capacitor parallel circuit (RLC circuit) by following the resonant frequency. In this way, the mass of the nanoparticle (5) and the normalized capacitance change created by the same are measured simultaneously. Any mass sensor and any capacitor sensor capable of measuring nanoparticles can be used in the present invention.

When an object with volume ($V_{particle}$), density ($d_{particle}$) and relative dielectric coefficient ($\epsilon_r$) is put into the system shown in FIG. 1, the mass sensor measures the total mass of the particle, that is, the product of its volume and density, according to Formula 2:

$$m_{particle} = V_{particle} \times d_{particle} \qquad \text{Formula 2}$$

Since this measurement directly measures the mass of the particle which is one of its most important physical properties, it provides an understanding of the particle size. The mass detector can actually be represented as the combination of the flexible spring (1) and the platform (2) in FIG. 1, and this mass detector measures the mass, which is the multiplication of volume and density. The main problem here is that the density is not known. On the other hand, the capacitance change created by the same particle in the capacitor sensor ($\Delta C$):

$$\Delta C = \left(\frac{C_0}{\epsilon_0 V_0}\right) V_{particle} \times \left(3 \times \frac{\epsilon_r - 1}{\epsilon_r + 2}\right) \qquad \text{Formula 3}$$

is measured by means of the capacitor sensor according to Formula 3. In this formula, $C_0$ is the pre-measurement capacitance of the capacitor sensor, $\epsilon_0$ is the electrical permittivity of free space, $V_0$ is the active measuring volume of the capacitor sensor (practically the volume between the (+) electrode (3) and the (−) electrode (4)). Since both the $\epsilon_0$, value and these two values ($C_0$, $V_0$) for each manufactured capacitor sensor are known with the design dimensions and post-manufacturing measurements, after the quantity $\Delta C$ measured in formula 3 is divided by the expression $$\left(\frac{C_0}{\epsilon_0 V_0}\right),$$

the normalized change of capacitance ($C_{particle}$) can be obtained:

$$C_{particle} \frac{\Delta C}{\left(\frac{C_0}{\epsilon_0 V_0}\right)} \qquad \text{Formula 4}$$

Therefore, $C_{particle}$ value:

$$C_{particle} = V_{particle} \times \left(3 \times \frac{\epsilon_r - 1}{\epsilon_r + 2}\right) \qquad \text{Formula 5}$$

is written as such and Formula 5 is obtained by measuring according to Formula 3 by the capacitor sensor and calculating according to Formula 4. In this way, a new quantity is defined as "Signal Ratio" by taking the ratio produced by these two sensors measuring the same particle simultaneously but with different physical principles:

$$\text{Signal Ratio} \equiv \frac{m_{particle}}{C_{particle}} = \frac{d_{particle}}{\left(3 \times \frac{\epsilon_r - 1}{\epsilon_r + 2}\right)} \qquad \text{Formula 1}$$

Thus, particle volume is excluded by taking the ratio of the two property measurements and a factor based solely on the particle's intensive (internal) properties (density ($d_{particle}$) and relative dielectric coefficient ($\epsilon_r$)) is obtained. This coefficient has different values for different materials as seen in Table 1. Therefore, it is possible to distinguish between nanoparticles naturally found in the environment (such as silicon dioxide ($SiO_2$), concrete, glass, paper) and/or nanoparticles released as a result of pollution. The received signal ratio for each material is given in Table 1. It is determined which material a nanoparticle comprises with the present invention with the help of the different signal ratios. A database is created by calculating the values in Table 1 and the data of each measurement is uploaded to the device, and thus a library is created wherein the results are processed, allowing the direct material information to be determined as a result of each measurement with the device.

TABLE 1

| Densities of different materials, relative dielectric coefficients and "Signal Ratio" properties obtained by the method subject to the present invention. | | | |
| --- | --- | --- | --- |
| Material | Density(g/cm³) | Relative Dielectric Coefficient ($\epsilon_r$) | Signal Ratio (g/cm³) |
| Polystyrene | 1.01 | 2.6 | 0.97 |
| Polycarbonate | 1.2 | 2.8 | 1.07 |
| Teflon | 2.2 | 2.1 | 2.73 |
| Polyethylene | 0.91 | 2.25 | 1.03 |
| $SiO_2$ (sand) | 2.65 | 3.9 | 1.80 |
| Rubber | 0.92 | 7 | 0.46 |
| Concrete | 2.4 | 4.5 | 1.49 |
| Paper | 1.2 | 1.4 | 3.40 |
| Pyrex (Glass) | 2.23 | 4.7 | 1.35 |

The present invention can be performed with any sufficiently precise mass sensor and capacitor detector. The important point in the method subject to the present invention is that two different sensors can operate independently of each other.

Two methods, namely mass and normalized capacitance change measurements are performed simultaneously in the present invention and the same particle is measured, giving a ratio of the intensive properties of the particle. Different embodiments of the invention are described below. In these embodiments, a mass sensor based on nano-electromechanical systems (NEMS) or micro-electromechanical systems (MEMS) is preferably used as said mass sensor, and a microwave resonance sensor or Wheatstone bridge is preferably used as said capacitor sensor.

The system used for mass measurement of the nanoparticle is preferably a NEMS-based mass sensor in the first application of the present invention realized with the first embodiment of the analyzer (FIG. 4 and FIG. 5), which is the subject of the present invention. Mass sensors can measure the masses of nanoparticles placed on them individually by means of resonance frequency shift. The (+) electrode (3) and (−) electrodes (4) of the capacitor sensor are placed on the mass sensor beam (17), which forms the mass sensor and mechanical vibrations of which are tracked, preferably suspended in the air on the chip so as to measure the capacitance of the nanoparticle simultaneously in the first embodiment and first application of the present invention. Therefore, a nanoparticle that falls between the (+) electrode (3) and (−) electrode (4) and whose capacitance can be measured can also be measured by the mechanical sensor. Said measurement takes place in the common precise measurement region (13) of the mass sensor and the capacitor sensor. The capacitor sensor is positioned above the mass sensor (preferably NEMS) in the first embodiment and first application of the analyzer described herein (FIGS. 4 and 5). Thus, the mass sensor and the capacitor sensor move together. The particle mass ($m_{particle}$) is obtained with the mass sensor frequency shift in this application, by placing a nanoparticle on a mass sensor (preferably NEMS). In FIG. 5, the common precise measurement region (13) is preferably the region of the NEMS structure between the (+) electrode (3) and (−) electrodes (4) of the capacitor sensor.

In this embodiment of the present invention, the capacitor sensor (preferably microwave resonance detector) with frequency shift:

$$\Delta C = -\frac{\Delta f_{MD}}{2 f_0} C_0 \qquad \text{Formula 6}$$

the capacitance change created by the particle is measured (Formula 6), where $\Delta f_{MD}$ shows the amount of resonance shift of the capacitor sensor, preferably the microwave resonance sensor, $f_0$ shows the original resonance frequency of the capacitor sensor, preferably the microwave resonance sensor and $C_0$ shows the original capacitance of the capacitor sensor, preferably the microwave resonance sensor. Thus, it is determined which material the particle consists of by determining the signal ratio mentioned before since both the mass of the particle and the normalized capacitance change it produces are measured simultaneously. The measured quantity is $\Delta f_{MD}$ where $\Delta C$ (Formula 6) and ($C_{particle}$) (Formula 4) are deduced. A low-pass filter is preferably used in the microwave sensor circuit so as to filter the effect of NEMS motion on the microwave sensor.

Not only the normalized capacitance change ($C_{particle}$), but also the resistive change ($R_{particle}$) generated by the particle is measured in the second application of the present invention, in the same way as the first application of the present invention, but in microwave resonance measurements. As is known, the relative dielectric coefficient ($\epsilon_r$) of a material consists of real and imaginary parts:

$$\epsilon_r = \epsilon' - j \epsilon'' \qquad \text{Formula 7}$$

Here $\epsilon'$ is the real part of the material that can store electrical energy, $\epsilon''$ shows the imaginary part that consumes electrical energy, $j=\sqrt{-1}$. While the real part of this dielectric creates a capacitive change in the measuring circuit; the virtual part creates a resistive change.

A system that can simultaneously measure both the original resonance frequency ($f_0$) shift and the change in bandwidth of the capacitor detector (microwave resonance detector) is created so as to measure both capacitive and resistive changes created by the particle simultaneously. This system is made by selecting a reference point from both the left and right of the resonance curve and using two independent phase locked loop (PLL) circuits that can follow these two points simultaneously.

The most important difference of the second application is that in addition to the Signal Ratio $$\left(\frac{m_{particle}}{C_{particle}}\right),$$

it allows to define and use a second Signal Ratio (Signal Ratio 2) depending on the resistance change of the particle by the processor in the electronic mobile device.

$$\text{Signal Ratio } 2 \equiv \frac{m_{particle}}{R_{particle}} \qquad \text{Formula 8}$$

Therefore, a second independent parameter based on the virtual part of the dielectric coefficient of the particle is used in determining the material type, thus resulting in increased sensitivity.

In the third application, which is another application of the invention, the microwave resonance measurements are made in the same way as the first application of the invention, but in high microwave modes, in addition to the microwave resonance mode (mode or intrinsic vibration) in the first application, and the characterization of the inserted particle depending on the relative dielectric coefficient at different frequencies is provided: since the dielectric coefficients of materials such as $\epsilon_r(f_1)$, $\epsilon_r (f_2)$, $\epsilon_r (f_3)$ etc. vary depending on the frequency and in different ways, these measurements at different frequencies provide additional information for the identification of the material.

In the fourth embodiment, which is another application of the present invention, realized with the second embodiment of the analyzer subject to the present invention (FIG. 6 and FIG. 7), instead of positioning the (+) electrode (3) and (−) electrodes (4) of the mass sensor and capacitor sensor on the mass sensor (preferably NEMS) (in contrast to the first embodiment of the present invention), they are positioned close to the mass sensor (preferably NEMS) but in the form of two immovable structures on either side of the suspending and moving mass sensor beam (17). Thus, the mass sensor and the capacitor sensor do not move together. The effect of mass sensor movement on the capacitor sensor (preferably microwave resonance sensor) is filtered and eliminated more effectively in this application. As in the previous applications, the particle mass ($m_{particle}$) is measured over the mass sensor (preferably NEMS) and the normalized capacitance change ($C_{particle}$) formed by the particle is measured over the capacitor sensor (preferably microwave resonance sensor) in this application.

In the fifth embodiment, which is another application of the present invention, the mass measurement is made via a mass sensor (preferably NEMS), while the normalized capacitance change ($C_{particle}$) measurement is made over a capacitive Wheatstone bridge. In this application, a Wheatstone bridge consisting of four capacitors is preferably formed on the NEMS chip, and a part of one of these capacitors is preferably positioned on the NEMS sensor, as in the first application of the invention.

In the sixth embodiment, which is another application of the present invention, the mass measurement is made via a mass sensor (preferably NEMS), while the normalized capacitance change ($C_{particle}$) measurement is made over a capacitive Wheatstone bridge. In this application, a Wheatstone bridge consisting of four capacitors is preferably formed on the NEMS chip, and a part of one of these capacitors is preferably positioned as the (+) electrode (3) and (−) electrode (4) to be placed between the NEMS sensor, as in the fourth application of the invention.

In all previous applications, including the sixth application of the present invention, the inner ring (8) and the capacitor sensor are all located on the chip (preferably the NEMS chip) and all transactions take place on the chip. The first and second embodiments, in which the first six applications of the invention are realized, are monolithic. In the seventh and eighth applications after the sixth application of the invention, different heterogeneous embodiments are used and said capacitor sensor is not all on the chip, some of it is positioned on the printed circuit board (PCB). In the seventh and eighth applications, which are the other applications of the invention, realized with the third and fourth embodiments of the analyzer subject to the present invention, part of the capacitor sensor is built on the printed circuit board (PCB) that carries the chip, the part containing the common precise measurement area (13) of the mass sensor and capacitor sensor between the (+) electrode (3) and (−) electrode (4) is on the chip. The advantage of these embodiments and the method is that the production of the capacitive sensor (preferably microwave resonator) can be carried out more easily and by using higher quality materials.

In fact, the heterogeneous version of the first application realized with the monolithic first embodiment of the invention is disclosed in the seventh application realized with the third embodiment of the analyzer which is the subject of the present invention. In this seventh application, the mass sensor contact pad (11) and capacitor sensor contact pad (21) of the analyzer shown in FIG. 8 are located on the mass sensor, preferably NEMS chip, and these contact pads are connected to a part of the capacitor sensor on the PCB, preferably a part of the microwave resonator. In this application, the common precise measurement region (13) of the mass sensor and the capacitor sensor and the (+) electrode (3) and (−) electrodes (4) are located on the chip.

In said seventh application which is the same as the first embodiment of the invention, but herein the capacitor sensor (preferably microwave resonance sensor) is located on a place other than the mass sensor (like the PCB where the NEMS will be located) instead of being located on the mass sensor (preferably NEMS). The signal of mass sensor control and measurement electrodes (14) in the common precise measurement region (13) of the mass sensor and capacitor sensor transmitted over the mass sensor contact pads (11) via wire connection. In the seventh application of the present invention, (+) electrode (3) and (−) electrodes (4) of the capacitance sensor are placed on the mass sensor beam (17), which forms the mass sensor and where the mechanical vibrations are followed so as to measure the capacitance of the nanoparticle simultaneously. Therefore, a nanoparticle that falls between the (+) electrode (3) and (−) electrode (4) and whose capacitance can be measured can also be measured by the mechanical sensor. Said measurement takes place in the common precise measurement region (13) of the mass sensor and the capacitor sensor. In the third embodiment of the analyzer described herein, the capacitor sensor is located on the mass sensor (preferably NEMS), similar to the first embodiment of the invention. Thus, the mass sensor and the capacitor sensor move together. The particle mass ($m_{particle}$) is obtained with the mass sensor frequency shift in this application, by placing a nanoparticle on a mass sensor (preferably NEMS).

In fact, the heterogeneous version of the fourth application realized with the monolithic second embodiment of the present invention is disclosed in the eighth application realized with the fourth embodiment of the analyzer which is the subject of the present invention. Herein, the signal is transmitted via wire connection of a capacitor sensor (preferably a microwave resonance detector) preferably located at a location other than NEMS, to the mass sensor control and measurement electrodes (14) produced in the same way as in the third embodiment, but close to the mass sensor (preferably NEMS) and not moving with the mass sensor.

In the eighth application, instead of positioning the (+) electrode (3) and (−) electrodes (4) of the mass sensor and capacitor sensor on the mass sensor (preferably NEMS) (in contrast to the first and third embodiment of the present invention), they are positioned close to the mass sensor (preferably NEMS) but in the form of two immovable structures on either side of the suspending and moving mass sensor beam (17). Thus, the mass sensor and the capacitor sensor do not move together. The effect of mass sensor movement on the capacitor sensor (preferably microwave resonance sensor) is filtered and eliminated more effectively in this application. As in the previous applications, the particle mass ($m_{particle}$) is measured over the mass sensor (preferably NEMS) and the normalized capacitance change ($C_{particle}$) formed by the particle is measured over the capacitor sensor (preferably microwave resonance sensor) in this application.

The invention claimed is:

1. An analyzer for simultaneously determining the size and material properties of a nanoparticle, comprising a mass sensor, a capacitor sensor and a common precise measurement region of the mass sensor and capacitor sensor, wherein said mass sensor and capacitor sensor provide common measurement.

2. The analyzer according to claim 1, wherein (+) electrode and (−) electrodes of the capacitor sensor and the common precise measurement area of the mass sensor and capacitor sensor located between these electrodes is positioned on the mass sensor on the chip so as to allow said mass sensor and capacitor sensor to move together.

3. The analyzer according to claim 1, wherein (+) electrode and (−) electrodes of the capacitor sensor are positioned on the chip as two non-moving electrodes on either side of the mass sensor in a manner such that said mass sensor and capacitor sensor do not move together.

4. The analyzer according to claim 1, wherein said analyzer is in monolithic structure.

5. The analyzer according to claim 1, wherein part of the capacitor sensor is positioned on the printed circuit board (PCB) and (+) electrode and (−) electrodes of the capacitor sensor and the common precise measurement area of the mass sensor and capacitor sensor located between these electrodes is positioned on the mass sensor on the chip so as to allow said mass sensor and capacitor sensor to move together.

6. The analyzer according to claim 1, wherein part of the capacitor sensor is positioned on the printed circuit board (PCB) and (+) electrode and (−) electrodes of the capacitor sensor are positioned on the chip as two non-moving electrodes on either side of the mass sensor in a manner such that said mass sensor and capacitor sensor do not move together.

7. The analyzer according to claim 5, wherein said analyzer has a heterogeneous structure.

8. The analyzer according to claim 5, wherein the mass sensor contact pad and the capacitor sensor contact pad are positioned on said chip.

9. The analyzer according to claim 2 wherein the (+) electrode and (−) electrodes of said capacitor sensor are on the mass sensor beam suspended in the air, which is not in direct contact with the silicon substrate.

10. The analyzer according to claim 9, wherein said mass sensor beam is made of silicon nitride.

11. The n analyzer according to any of the claim 1, wherein said mass sensor is a mass sensor based on nano electromechanical systems (NEMS) or micro electromechanical systems (MEMS).

12. The analyzer according to claim 1, wherein; said capacitor sensor is a microwave resonance sensor or a Wheatstone bridge.

13. The analyzer according to claim 1, wherein said nanoparticle is in spherical or spherelike form.

14. An analysis method for simultaneously determining the size and material properties of nanoparticles, comprising the following process steps:

measuring the mass of a nanoparticle ($m_{particle}$) with a mass sensor in a common precise measurement region of the mass sensor and a capacitor sensor, in the same system, of measuring a capacitance change (AC) formed by the same nanoparticle by the capacitor sensor in the common precise measurement region of the mass sensor and capacitor sensor, according to Formula 3:

$$\Delta C = \left(\frac{C_0}{\epsilon_0 V_0}\right) V_{particle} \times \left(3 \times \frac{\epsilon_r - 1}{\epsilon_r + 2}\right) \qquad \text{Formula 3}$$

wherein, $\Delta C$ is the capacitance change created by the nanoparticle in the capacitor sensor, $c_0$ is the premeasurement capacitance of the capacitor sensor, $\epsilon_0$ is the electrical permittivity of empty space, $\epsilon_r$ is the relative dielectric coefficient of the particle, $v_0$ is the active measurement volume of the capacitor sensor, calculating the $C_{particle}$ value, which is the capacitance change normalized by a processor in electronic mobile devices by scaling the quantity AC measured according to the formula 3 according to the characteristics of the capacitor sensor, and dividing the same by the expression $$\left(\frac{C_0}{\epsilon_0 V_0}\right):$$

$$C_{particle} \equiv \frac{\Delta C}{\left(\frac{C_0}{\epsilon_0 V_0}\right)} \qquad \text{Formula 4}$$

processing the signal ratio of the nanoparticle by the processor in electronic mobile devices according to Formula 1 by taking the ratio of the of the nanoparticle to the normalized capacitance change ($C_{particle}$) of the nanoparticle, determining the same and obtaining a factor based on the nanoparticle's density ($d_{particle}$) and the relative dielectric coefficient ($\epsilon_r$), $$\text{Signal Ratio} \equiv \frac{m_{particle}}{C_{particle}} = \frac{d_{particle}}{\left(3 \times \frac{\epsilon_r - 1}{\epsilon_r + 2}\right)} \qquad \text{Formula 1}$$

determining the material property of the nanoparticle according to the signal ratio of the nanoparticle calculated by said processor according to the formula 1.

15. The analysis method according to claim 14, wherein said mass sensor is a mass sensor based on nano electromechanical systems (NEMS) or micro electromechanical systems (MEMS).

16. The analysis method according to claim 14, wherein said capacitor sensor is a microwave resonance sensor or a Wheatstone bridge.

17. The analysis method according to claim 14, wherein said electronic mobile devices are computers, tablets or phones.

18. The analysis method according to claim 14, wherein it is the measurement of the capacitance change created by the nanoparticle according to Formula 6 with the capacitor sensing frequency shift for simultaneous measurement of the mass and capacitance of the nanoparticle:

$$\Delta C = -\frac{\Delta f_{MD}}{2 f_0} C_0 \qquad \text{Formula 6}$$

Wherein $\Delta f_{MD}$ is the amount of resonance shift of the capacitor sensor, $f_0$ is the original resonance frequency of the capacitor sensor and $c_0$ is the original capacitance of the capacitor sensor.

19. The analysis method according to claim 18, wherein simultaneously measuring of the nanoparticle's normalized capacitance change ($C_{particle}$) and resistive change ($R_{particle}$) and determining a second signal ratio by the processor in the electronic mobile device according to Formula 8, by further creating a system that simultaneously measures the shift of the original resonant frequency ($f_0$) of the capacitor sensor and the change in bandwidth, $$\text{Signal Ratio 2} \equiv \frac{m_{particle}}{R_{particle}} \qquad \text{Formula 8}$$

wherein ($m_{particle}$) is the mass of the nanoparticle.

20. The analysis method according to claim 18, wherein nanoparticle depending on the relative dielectric coefficient is further performed at different frequencies.

* * * * *